United States Patent [19]

Berner et al.

[11] Patent Number: 5,510,539

[45] Date of Patent: Apr. 23, 1996

[54] LIQUID PHOTOINITIATOR MIXTURES

[75] Inventors: Godwin Berner, Binningen; Franciszek Sitek, Therwil; Rinaldo Hüsler, Marly, all of Switzerland

[73] Assignee: Ciba-Geigy Corporation, Tarrytown, N.Y.

[21] Appl. No.: 315,991

[22] Filed: Sep. 30, 1994

Related U.S. Application Data

[60] Continuation of Ser. No. 162,733, Dec. 3, 1993, abandoned, which is a division of Ser. No. 732,986, Jul. 19, 1991, Pat. No. 5,288,917, which is a continuation of Ser. No. 593,601, Oct. 4, 1990, abandoned, which is a continuation of Ser. No. 401,576, Aug. 28, 1989, abandoned, which is a continuation of Ser. No. 34,518, Apr. 6, 1987, abandoned.

[30] Foreign Application Priority Data

Apr. 15, 1986 [CH] Switzerland .............................. 1487/86

[51] Int. Cl.$^6$ ..................................................... C08F 2/50
[52] U.S. Cl. .......................... 568/376; 568/331; 568/336; 522/17; 522/18; 522/23; 522/44
[58] Field of Search ..................................... 568/376, 336, 568/331; 522/17, 18, 23, 44

[56] References Cited

U.S. PATENT DOCUMENTS

| 3,715,293 | 2/1973 | Sandner et al. | 522/44 |
| 4,190,602 | 2/1980 | Brunisholz et al. | 522/44 |
| 4,707,432 | 11/1987 | Gatechair et al. | 522/29 |

FOREIGN PATENT DOCUMENTS

| 24987 | 2/1979 | Japan . |
| 124723 | 9/1979 | Japan . |

OTHER PUBLICATIONS

Translation of JP 24987.
Translation of JP 124723.

Primary Examiner—Mark Chapman
Attorney, Agent, or Firm—William A. Teoli, Jr.

[57] ABSTRACT

Liquid highly active photoinitiators are obtained by dissolving a solid photoinitiator of the titanocene type in liquid photoinitiators of the acetal or ketal type. The liquid mixtures have a long dark storage stability.

9 Claims, No Drawings

LIQUID PHOTOINITIATOR MIXTURES

This is a continuation of Ser. No. 08/162,733, filed Dec. 3, 1993, now abandoned, which is a divisional of Ser. No. 07/732,986, filed Jul. 19,1991, now U.S. Pat. No. 5,288,917 which is a continuation of Ser. No. 07/593,601, filed Oct. 4, 1990, now abandoned, which is a continuation of Ser. No. 07/401,576, filed Aug. 28, 1989, now abandoned, which is a continuation of Ser. No. 07/034,518, filed Apr. 6, 1987, now abandoned.

The present invention relates to liquid mixtures of photoinitiators, in particular to solutions of solid titanocene compounds in liquid photoinitiators of the ketal type. The present invention further relates to photocurable compositions which contain such liquid photoinitiator mixtures.

Titanocene compounds having fluoroaromatic radicals are known from EP-A-122,223 as highly effective initiators for the photopolymerization of ethylenically unsaturated compounds. The compounds described there are all solid and very sparingly soluble in the customary photopolymerizable compounds or mixtures. There exists a demand for readily soluble or liquid photoinitiators of high activity. It has now been found that a combination of titanocene initiators with liquid photoinitiators of the ketal or acetal type leads to liquid initiators of remarkably high activity. Suitable liquid photoinitiators of the acetal or ketal type are in particular benzil ketals, 4-aroyl-1,3-dioxolanes and dialkoxyacetophenones.

Photoinitiators of the type of the benzil ketals are known from U.S. Pat. No. 3,715,293, DE-B-2,232,365, GB-B-1, 390,006 or EP-A-2,707. The compounds described therein include not only solid but also liquid compounds. According to the invention, only the liquid ketals are used, including ketals which have hitherto not been disclosed.

Photoinitiators of the type of the 4-aroyl-1,3-dioxolanes are known from EP-A-108,037. Most of these compounds are liquid.

Photoinitiators of the type of the α-dialkoxyacetophenones are known from U.S. Pat. No. 3,715,293. Most of the compounds are also liquid.

The present invention relates to liquid photoinitiator mixtures consisting of
A) 70–99.9% by weight of at least one liquid acetal or ketal photoinitiator selected from
$A_1$) a compound of the formula I $$Ar^1-\underset{\underset{OR^2}{|}}{\overset{\overset{O}{\|}}{C}}-\underset{|}{\overset{OR^1}{|}}{C}-Ar^2 \qquad I$$

in which $Ar^1$ and $Ar^2$ are independently of each other phenyl or $C_1$–$C_4$-alkyl- or halogen-substituted phenyl,
$R^1$ is $C_4$–$C_{20}$-alkyl, $C_3$–$C_{18}$-alkenyl, $C_7$–$C_{10}$-phenylalkyl, a group —CH($R^3$)—COOR$^4$, —R$^5$—X, +CH($R^3$)—CH($R^{10}$)—O $\}_m$—R$^6$ or tetrahydrofurfuryl, in which $R^3$ and $R^{10}$ are independently of each other hydrogen or methyl,
$R^4$ is $C_1$–$C_{20}$-alkyl, $C_3$–$C_5$-alkenyl or $C_3$–$C_8$-alkoxyalky
$R^5$ is $C_2$–$C_{10}$-alkylene,
X is halogen, —COOR$^4$, —OR$^4$ or —NR$^7$R$^8$, where R$^7$ is $C_1$–$C_{12}$-alkyl, allyl, benzyl, cyclohexyl, $C_2$–$C_4$-hydroxyalkyl or $C_3$–$C_8$-alkoxyalkyl, R$^8$ is hydrogen or has one of the meanings given for R$^7$, R$^7$ and R$^8$ together are $C_3$–$C_7$-alkylene which can be interrupted by O, S or NR$^9$ and R$^9$ is $C_1$–$C_4$-alkyl, $C_2$–$C_4$-hydroxyalkyl or 2-cyanoethyl,
m has the value from 1 to 30 and
$R^6$ is $C_1$–$C_{20}$-alkyl, $C_3$–$C_5$-alkenyl, $C_3$–$C_8$-alkoxyalkyl, $C_7$–$C_{22}$-alkylphenyl or $C_2$–$C_{20}$-alkanoyl, and
$R^2$ is $C_1$–$C_3$-alkyl or has one of the meanings given for $R^1$ or
$A_2$) a compound of the formula II in which
$R^{11}$ is hydrogen, unsubstituted- or hydroxyl- or $C_1$–$C_4$-alkoxy-substituted $C_1$–$C_{10}$-alkyl or $C_7$–$C_{10}$-phenylalkyl,
$R^{12}$ is phenyl, 2-furyl or trichloromethyl or has one of the meanings given for $R^{11}$, or $R^{11}$ and $R^{12}$ together with the C atom to which they are bonded form a cyclopentane or cyclohexane ring,
$R^{13}$ is $C_1$–$C_4$-alkyl, phenyl or Cl—, $C_1$–$C_4$-alkyl— or $C_1$–$C_4$-alkoxy-monosubstituted or —polysubstituted by phenyl,
$R^{14}$ is hydrogen or $C_1$–$C_4$-alkyl,
$R^{15}$ is hydrogen, $C_1$–$C_4$-alkyl, phenyl or trichloromethyl,
$R^{16}$ is hydrogen, chlorine, $C_1$–$C_4$-alkyl or $C_1$–$C_4$-alkoxy,
or
$A_3$) a compound of the formula III $$Ar^3-\overset{\overset{O}{\|}}{C}-\underset{\underset{OR^{19}}{|}}{\overset{\overset{OR^{18}}{|}}{C}}-R^{17} \qquad III$$

in which $Ar^3$ is phenyl or $C_1$–$C_4$-alkyl— or halogen-substituted phenyl,
$R^{17}$ is hydrogen, $C_1$–$C_8$-alkyl or $C_5$–$C_8$-cycloalkyl,
$R^{18}$ is $C_1$–$C_8$-alkyl or $C_3$–$C_8$alkoxyalkyl and
$R^{19}$ has one of the meanings given for $R^{18}$, and
B) 0.1–30% by weight of a titanocene photoinitiator selected from
$B_1$) a compound of the formula IV $$R^{23}-\underset{\underset{R^{22}}{|}}{\overset{\overset{R^{21}}{|}}{Ti}}-R^{24} \qquad IV$$

in which $R^{21}$ and $R^{22}$ are independently of each other an unsubstituted or $C_1$–$C_4$-alkyl—, chlorine—, phenyl— or cyclohexyl-substituted cyclopentadienyl or indenyl anion or $R^{21}$ and $R^{22}$ together are a divalent biscyclopentadienyl anion of the formula V, in which Z is methylene, dimethylene, trimethylene, $C_2$–$C_{12}$-alkylidene, $C_5$–$C_7$-cycloalkylidene, —Si($R^{25}$)($R^{26}$)— or —Sn($R^{25}$)$_2$— and
$R^{25}$ and $R^{26}$ are $C_1$–$C_{12}$-alkyl, phenyl or benzyl,
$R^{23}$ is the monovalent radical of a 6-membered carbocyclic or 5- or 6-membered heterocyclic aromatic ring which is substituted in at least one ortho-position relative to the bond to the Ti atom by fluorine and also by one or more of the groups halogen, $C_1$–$C_{12}$-alkyl, $C_1$–$C_{14}$-alkoxy, $C_2$–$C_{10}$-alkoxycarbonyl, aminocarbonyl of up to 12 carbon atoms or by a primary, secondary or tertiary amino or aminoalkyl group having up to 20 carbon atoms or a quaternary ammonium or ammoniumalkyl group having up to 30 C atoms, $R^{24}$ has one of the meanings given for $R^{23}$ or is $C_2$–$C_{12}$-alkynyl, phenylalkynyl having 2–5 C atoms in the alkynyl radical and is unsubstituted or substituted in the phenyl radical by halogen or $C_1$–$C_4$-alkyl, $C_1$–$C_{14}$-alkoxy, di-($C_2$–$C_4$-alkyl)-amino or a quaternary ammonium group, or is a group —$N_3$—, —CN, —Si($R^{25}$)$_3$, —Si($R^{25}$)$_2$($R^{26}$) or —Sn($R^{25}$)$_3$, or $R^{23}$ and $R^{24}$ together are a radical of the formula VI

in which Q is a carbocyclic or 5- or 6-membered heterocyclic aromatic ring which in the 2-position relative to the Y group is bonded to the titanium atom and in the 3-position is substituted by fluorine and can contain as further substituents $C_1$–$C_4$-alkyl, halogen, $C_1$–$C_4$-alkoxy, di-($C_1$–$C_4$-alkyl)amino or a quaternary $C_3$–$C_{20}$-ammonium group, Y is methylene, $C_2$–$C_{12}$-alkylidene, $C_5$–$C_7$-cycloalkylidene, a direct bond or a group —$NR^{27}$—, —O—, —S—, —SO—, —SO$_2$, —CO—, —Si($R^{25}$)($R^{26}$)— or —Sn($R^{25}$)$_2$— and $R^{27}$ is hydrogen, $C_1$–$C_{12}$-alkyl, cyclohexyl, phenyl, tolyl or benzyl, or B$_2$) a compound of the formula VII

in which $R^{21}$ and $R^{22}$ are as defined above, $R^{28}$ is the monovalent radical of a 6-membered carbocyclic or 5- or 6-membered heterocyclic aromatic ring which is substituted in at least one ortho-position relative to the bond to the Ti atom by —CF$_3$ and can additionally be substituted by one or more of the groups halogen, $C_1$–$C_{12}$-alkyl, $C_1$–$C_{14}$-alkoxy, $C_2$–$C_{10}$-alkoxycarbonyl or aminocarbonyl or by a primary, secondary or tertiary amino or aminoalkyl group having up to 20 C atoms or a quaternary ammonium or ammonium-alkyl group having up to 30 C atoms, and $R^{29}$ has one of the meanings given for $R^{28}$ or is $C_2$–$C_{12}$-alkynyl, phenylalkynyl having 2–5 C atoms in the alkynyl radical which is unsubstituted or substituted in the phenyl radical by halogen or $C_1$–$C_4$-alkyl, or is halogen or a group —Si($R^{25}$)$_3$, —Si($R^{25}$)$_2$($R^{26}$), —Sn($R^{25}$)$_3$, —OH, $C_1$–$C_{10}$-alkoxy, $C_6$–$C_{10}$-aryloxy, unsubstituted or halogen-substituted $C_1$–$C_6$-acyloxy, —N$_3$, —CN, —NCO or —NCS.

A Cl4-$C_{20}$-alkyl $R^1$ or $R^2$ in the formula I can be unbranched or branched alkyl, for example n-butyl, isobutyl, isopentyl, n-hexyl, 2-ethylbutyl, isoheptyl, n-octyl, 2-ethylhexyl, n-decyl, n-dodecyl, tetradecyl, hexadecyl, octadecyl or eicosyl. Preferably alkyl $R^1$ is an alkyl radical having 4–18, in particular 4–16, C atoms.

$C_1$–$C_{20}$-alkyls $R^4$ and $R^6$ can have the same meanings as $R^1$ or $R^2$, but in addition can also be methyl, ethyl, n-propyl or isopropyl.

$C_3$–$C_5$ alkenyls $R^1$, $R^2$, $R^4$ and $R^6$ can be for example allyl, methallyl, 2-butenyl or 2-methyl-2-butenyl.

$C_3$–$C_{18}$-alkenyls $R^1$ and $R^2$ can in addition also be for example 2-hexenyl, 2-octenyl or oleyl.

$C_3$–$C^8$-alkoxyalkyls $R^4$ and $R^6$ can be for example 2-methoxyethyl, 2-ethoxyethyl, 2-butoxyethyl, 2-isohexyloxyethyl, 2-ethoxypropyl, 2-isopropoxypropyl or 2-ethoxybutyl.

$C_7$–$C_{10}$-phenylalkyls $R^1$ and $R^2$ can be for example benzyl, 1-phenylethyl, 2-phenylethyl, 2-phenylpropyl or 2-phenylbutyl.

A $C_7$–$C_{22}$-alkylphenyl $R^6$ can be for example 3-methylphenyl, 3,5-dimethylphenyl, 4-isopropylphenyl, 4-tertbutylphenyl, 4-octylphenyl, 2,4-dioctylphenyl, 4-nonylphenyl, 4-decylphenyl, 4-dodecylphenyl or 3-pentadecylphenyl.

A $C_2$–$C_{20}$-alkanoyl $R^6$ can be for example acetyl, propionyl, butyryl, hexanoyl, octanoyl, decanoyl, lauroyl, stearoyl or eikosanoyl.

Halogen X can be for example Cl or Br. An amine radical —NR$^7$R$^8$ X can be for example ethylamino, dodecylamino, dimethylamino, dibutylamino, N-methylbutylamino, di(2-ethylbutyl)amino, di(2-hydroxyethyl)amino, di(2-methoxyethyl)amino, allylamino, diallylamino, N-methylbenzylamino, N-methylcyclohexylamino, N-hydroxyethylcyclohexylamino, di(2-butoxyethyl)amino, pyrrolidino, piperidino, morpholino, piperazino, 4-methylpiperazino, 4-hydroxyethylpiperazino or 4-cyanoethylpiperazino.

$R^5$ can be unbranched or branched $C_2$–$C_{10}$-alkylene, for example 1,2-ethylene, trimethylene, tetramethylene, hexamethylene, octamethylene, 1,2-propylene, 2,2-dimethyltrimethylene or 2,4,4-trimethylhexamethylene. Preferably $R^5$ is $C_2$–$C_4$-alkylene, in particular 1,2-ethylene.

A —[—CH($R^3$)—CH($R^{10}$)—O—]$_m$R$^6$ radical $R^1$ is a radical of oxyalkylated alcohols, alkylphenols or fatty acids. These radicals can come from uniform compounds, for example when m is small and $R^6$ is low. When, however, m is relatively large and $R^6$ is a higher alkyl radical or alkylphenyl radical, these oxyalkylated compounds are usually only obtainable as mixtures. These technical-grade mixtures can contain not only compounds having different values of m but also compounds having different $R^6$s. Using such technical-grade mixtures for preparing the ketals of the formula I gives corresponding ketal mixtures in which m and $R^6$ can only be defined as average values.

Preferably $R^1$ is $C_4$–$C_{18}$-alkyl, $C_3$–$C_5$-alkenyl, —CH$_2$COOR$^4$, —R$^5$X, —[—CH($R^3$)—CH$_2$O—]$_m$R$_6$ or tetrahydrofury where $R^3$ is H or CH$_3$, $R^4$ is $C_1$–$C_{18}$-alkyl, allyl or $C_3$–$C_6$-alkoxyalkyl, $R^5$ is $C_2$–$C_4$-alkylene, is halogen, —COOR$^4$, —OR$^4$ or a tertiary amino group having 2–12 C atoms, m is 1–25 and $R^6$ is $C_1$–$C_{18}$-alkyl or $C_{12}$–$C_{22}$-alkylphenyl.

Particularly preferably $R^1$ is $C_4$–$C_{16}$-alkyl, —CH$_2$COO($C_1$–$C_4$-alkyl), —CH$_2$CH$_2$X or —[—CHCH$_2$O—]$_m$R$_6$, where X is chlorine, $C_1$–$C_8$-alkoxy or a tertiary amino group having 2–8 C atoms, m is a value of 2–20 and $R^6$ is $C_8$–$C_{16}$-alkyl or $C_{13}$–$C_{16}$-alkylphenyl.

A tertiary amino group X can be an open-chain or cyclic amino group, for example dimethylamino, N-methylcyclohexylamino, morpholino or piperidino.

$R^2$ is preferably methyl or has one of the meanings given for $R^1$.

Examples of compounds of the formula I which are liquid and can be used as component A for the mixtures according to the invention are the benzyl ketals of the following formula

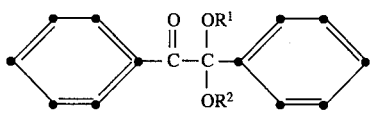

$R^1 = R^2 = -(CH_2)_3CH_3$
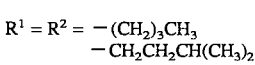

-continued

—CH$_2$—CH—C$_4$H$_9$
　　　|
　　C$_2$H$_5$

—(CH$_2$)$_9$CH$_3$
—C$_{10}$H$_{21}$-iso
—C$_{12}$H$_{25}$-n
—C$_{14}$H$_{29}$
—C$_9$H$_{19}$ to —C$_{11}$H$_{23}$　mixture
—C$_{12}$—H$_{25}$— to —C$_{15}$H$_{31}$— mixture
—CH$_2$CH=CH$_2$
—CH(CH$_3$)CH=CH$_2$
—CH$_2$CH$_2$OC$_3$H$_7$-iso
—CH$_2$CH$_2$OC$_4$H$_9$
—CH$_2$CH$_2$OCH$_2$CH=CH$_2$
—CH(CH$_3$)—CH$_2$OC$_4$H$_9$
—CH$_2$COOCH$_3$
—CH$_2$COOC$_4$H$_9$
—CH(CH$_3$)COOCH$_3$
—CH$_2$CH$_2$COOC$_2$H$_5$
—CH(CH$_3$)CH$_2$COOCH$_3$
—CH$_2$CH$_2$CH(CH$_3$)OCH$_3$

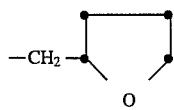

—(CH$_2$CH$_2$O)$_2$CH$_3$
—(CH$_2$CH$_2$O)$_2$C$_2$H$_5$
—(CH$_2$CH$_2$O)$_2$C$_4$H$_9$
—(CH$_2$CH$_2$O)$_3$CH$_3$
—(CH$_2$CH$_2$O)$_3$C$_2$H$_5$
—(CH$_2$CH$_2$O)$_3$C$_{12}$H$_{25}$
—(CH$_2$CH$_2$O)$_3$C$_{10}$H$_{21}$
—(CH$_2$CH$_2$O)$_5$C$_9$H$_{19}$— to —C$_{11}$H$_{23}$ (mixture)
—(CH$_2$CH$_2$O)$_3$—C$_{12}$H$_{25}$ to C$_{15}$—C$_{31}$ (mixture)
—(CH$_2$CH$_2$O)$_5$—C$_{10}$H$_{21}$
—(CH$_2$CH$_2$O)$_5$—C$_9$H$_{19}$ to —C$_{11}$H$_{23}$ (mixture)
—(CH$_2$CH$_2$O)$_7$—C$_{12}$H$_{25}$ to —C$_{15}$H$_{31}$ (mixture)
—(CH$_2$CH$_2$O)$_8$—C$_{10}$H$_{21}$
—(CH$_2$CH$_2$O)$_{11}$—C$_{14}$H$_{29}$

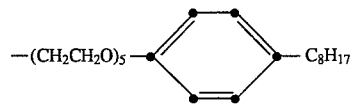
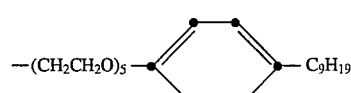
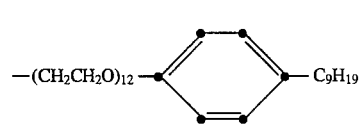

—(CH$_2$CH$_2$O)$_8$—CO—C$_{11}$H$_{23}$

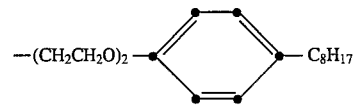

—CH$_2$CH$_2$N(C$_2$H$_5$)$_2$

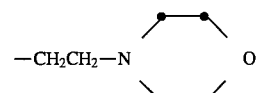

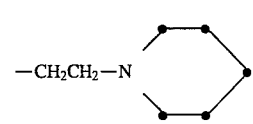

—CH$_2$CH$_2$—N⟨　⟩N—CH$_3$

R$^2$ = CH$_3$, R$^1$ = C$_6$H$_{13}$
R$^2$ = CH$_3$, R$^1$ = C$_{10}$H$_{21}$
R$^2$ = CH$_3$, R$^1$ = —(CH$_2$CH$_2$O)$_3$—C$_9$H$_{19}$ to —C$_{11}$H$_{23}$ (mixture)
R$^2$ = CH$_3$, R$^1$ = —(CH$_2$CH$_2$O)$_5$—C$_9$H$_{19}$ to —C$_{11}$H$_{23}$ (mixture)

R$^2$ = CH$_3$, R$^1$ = —C$_{14}$H$_{29}$
R$^2$ = CH$_3$, R$^1$ = —C$_9$H$_{19}$ to C$_{11}$H$_{23}$ (mixture)
R$^2$ = CH$_3$, R$^1$ = —C$_{12}$H$_{25}$ to —C$_{15}$H$_{31}$ (mixture)
R$^2$ = C$_2$H$_5$, R$^1$ = —(CH$_2$CH$_2$O)$_3$—C$_{12}$H$_{25}$ to —C$_{15}$H$_{31}$ (mixture)
R$^2$ = CH$_3$, R$^1$ = —(CH$_2$CH$_2$O)$_5$—C$_{12}$H$_{25}$ to —C$_{15}$H$_{31}$ (mixture)
R$^2$ = CH$_3$, R$^1$ = —(CH$_2$CH$_2$O)$_9$—C$_{12}$H$_{25}$ to —C$_{15}$H$_{31}$ (mixture)

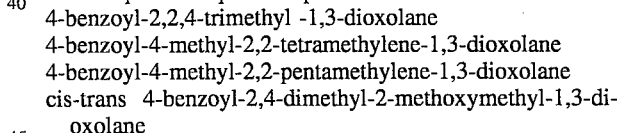

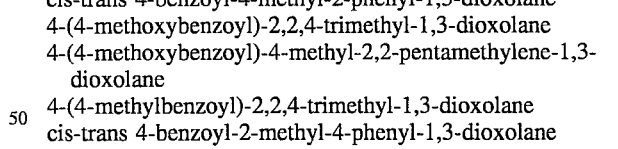

R$^2$ = CH$_3$, R$^1$ = —(CH$_2$CH$_2$O)$_3$—CO—C$_{11}$H$_{23}$

R$^2$ = CH$_3$, R$^1$ = —(CH$_2$CH$_2$O)$_8$—C(=O)—C$_{11}$H$_{23}$

In the formula II, R$^{11}$, R$^{12}$, R$^{13}$, R$^{14}$, R$^{15}$ and R$^{16}$ can be C$_1$–C$_4$-alkyl, for example methyl, ethyl, n-propyl, isopropyl, n-butyl or isobutyl. R$^{11}$ and R$^{12}$ can in addition also be C$_5$–C$_{10}$-alkyl, for example pentyl, hexyl, octyl or decyl. Alkoxyalkyls R$^{11}$ and R$^{12}$ can be for example ethoxymethyl, 2-methoxyethyl, 2-butoxypropyl or 2-isopropoxybutyl. Phenylalkyls R$^{11}$ and R$^{12}$ can be for example benzyl, 1-phenylethyl, 2-phenylethyl or 3-phenylpropyl.

Examples of liquid compounds of the formula II are:
4-benzoyl-2,2,4-trimethyl -1,3-dioxolane
4-benzoyl-4-methyl-2,2-tetramethylene-1,3-dioxolane
4-benzoyl-4-methyl-2,2-pentamethylene-1,3-dioxolane
cis-trans 4-benzoyl-2,4-dimethyl-2-methoxymethyl-1,3-dioxolane
cis-trans 4-benzoyl-4-methyl-2-phenyl-1,3-dioxolane
4-(4-methoxybenzoyl)-2,2,4-trimethyl-1,3-dioxolane
4-(4-methoxybenzoyl)-4-methyl-2,2-pentamethylene-1,3-dioxolane
4-(4-methylbenzoyl)-2,2,4-trimethyl-1,3-dioxolane
cis-trans 4-benzoyl-2-methyl-4-phenyl-1,3-dioxolane
4-benzoyl-2,2,4,5,5-pentamethyl-1,3-dioxolane
cis-trans 4-benzoyl-2,2,4,5-tetramethyl-1,3-dioxolane
cis-trans 4-benzoyl-4-methyl-2-pentyl-1,3-dioxolane
cis-trans 4-benzoyl-2-benzyl-2,4-dimethyl-1,3-dioxolane
cis-trans 4-benzoyl-2-(2-furyl)-4-methyl-1,3-dioxolane
cis-trans 4-benzoyl-5-phenyl-2,2,4-trimethyl-1,3-dioxolane
4-(4-methoxybenzoyl)-2,2,4,5,5-pentamethyl-1,3-dioxolane In the compounds of the formula III, Ar$^3$ can be phenyl or substituted phenyl, for example 4-chlorophenyl, 4-fluorophenyl, 4-tolyl, 2,4-xylyl or 4-tert-butylphenyl.

C$_1$–C$_8$ alkyls R$^{17}$, R$^{18}$ and R$^{19}$ can be unbranched or branched, for example methyl, ethyl, n-propyl, n-butyl, isobutyl, n-amyl, n-hexyl, 2-ethylbutyl, isoheptyl, n-octyl or 2-ethylhexyl. A C$_5$–C$_8$-cycloalkyl R$^{17}$ can be for example cyclopentyl, cyclohexyl, methylcyclohexyl or cyclooctyl. C$_3$–C$_8$-alkoxyalkyls R$^{18}$ and R 19 can be for example 2-methoxyethyl, 2-butoxyethyl, 2-hexyloxyethyl, 3-methoxypropyl or 2-ethoxypropyl.

Preferably $Ar^3$ is phenyl, $R^{17}$ is hydrogen and $R^{18}$ and $R^{19}$ are $C_1$–$C_4$-alkyl.

Examples of liquid compounds of the formula III are:
α,α-dimethoxyacetophenone
α,α-diethoxyacetophenone
α,α-di-isopropoxyacetophenone
α,α-di-(2- methoxyethoxy)acetophenone
α,α-butoxy-α-ethoxyacetophenone
α,α-dibutoxy-4-chloroacetophenone
α,α-diethoxy-4-fluoroacetophenone
α,α-dimethoxy-4-methylacetophenone
α,α-dimethoxy-4-methylacetophenone
α,α-dimethoxypropiophenone
α,α-diethoxypropiophenone
α,α-diethoxybutyrophenone
α,α-dimethoxyisovalerophenone
α,α-diethoxy-α-cyclohexylacetophenone
α,α-dipropoxy-4-chloropropiophenone In the compounds of the formulae IV and VII, the titanium atom is bonded to two π-anions of the cyclopentadienyl type. The two anions can be covalently bonded to each other via the bridge Z, thereby forming a ligand of the formula V.

Examples of such groups Z are

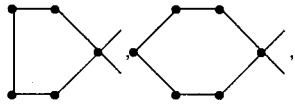,

In the compounds of the formula IV, the titanium is also covalently bonded to at least one aromatic radical R The aromatic radical can be carbocyclic or heterocyclic and must be substituted by fluorine in the ortho-position relative to the C-Ti bond. Examples of such aromatic radicals are fluorinated benzenes, naphthalenes, furans, thiophenes, pyrroles, pyridines, pyrimidines, pyrazoles, imidazoles, oxazoles or thiazoles which can additionally carry other substituents, such as halogen atoms, alkyl or alkoxy groups, alkyloxycarbonyl or aminocarbonyl groups, amino groups or aminoalkyl groups, and quaternization products thereof. Examples of such substituents are fluorine, chlorine, bromine, methyl, ethyl, isopropyl, tert.-butyl, n-nonyl or n-dodecyl, methoxy, ethoxy, butoxy, octyloxy, decyloxy, dodecyloxy, methoxycarbonyl, ethoxycarbonyl, butoxycarbonyl, 2-ethylhexyloxy or n-decyloxy, aminocarbonyl, butylaminocarbonyl, diethylaminocarbonyl or pyrrolidinocarbonyl, $-NH_2$, $-NHC_4H_9$, $-N(CH_3)_2$, $-N(CH_3)_3^\oplus Cl^\ominus$ morpholino, piperidino, $-CH_2NH_2$, $-CH_2N(C_2H_5)_2$, $-CH_2N(C_2H_5)_3^\oplus Br^\ominus$ or pyrrolidinomethyl.

Preferably $R^{23}$ is a benzene radical which is substituted in the two ortho-positions by fluorine.

$R^{24}$ can likewise be a monovalent fluoroaromatic radical or is an alkynyl or phenylalkynyl group which can be appropriately substituted in the phenyl radical, or $R^{24}$ is an azido, cyano, triorganosilyl or triorganostannyl radical.

An alkynyl $R^{24}$ can be for example ethynyl, 1-propynyl, 1-butynyl, 2-hexynyl, 1-octynyl, 1-decynyl or 1-dodecynyl. An unsubstituted or substituted phenylalkynyl $R^{24}$ can be for example 2-phenylethynyl, 3-phenylpropynyl, 3-phenylbutynyl, 2-(4-chlorophenyl)-ethynyl or 3-(4-tolyl)propynyl.

A triorganosilyl or triorganostannyl radical $R^{24}$ can be for example trimethylsilyl, triphenylsilyl, dimethylphenylsilyl, methyldiphenylsilyl, tributylsilyl, trimethylstannyl, tributylstannyl, trioctylstannyl or tri(dodecyl) stannyl.

$R^{23}$ and $R^{24}$ can be bonded to a divalent aromatic radical of the formula VI. Therein the Qs are carbocyclic or heterocyclic radicals which are bonded in the 2-position relative to the linkage Y to the titanium atom and are substituted in the 3-position by fluorine. Examples of such divalent groups are the following groups, in which E is $-O-$, $-S-$ or $-NH-$:

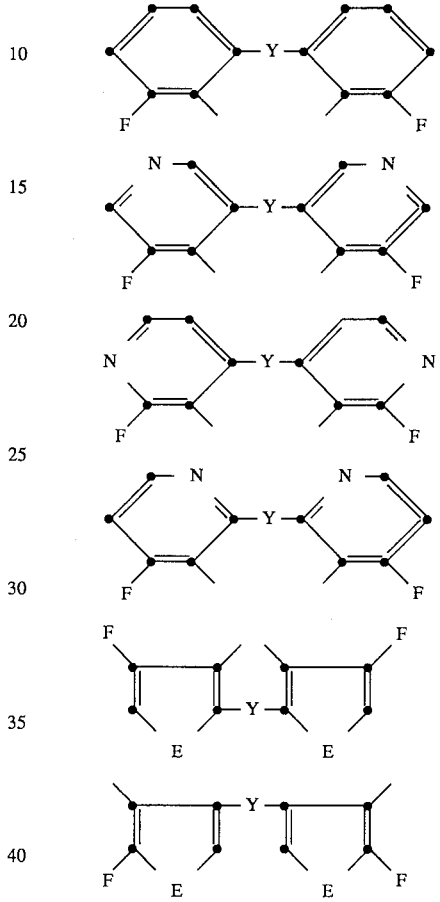

The aromatic radicals Q can carry further substitutents, in particular halogen, methyl and dimethylamino. The bridge member Y can be a direct bond, a divalent atom or a divalent group. Preferably Y is $-CH_2-$, $CH_3CH$, $C_2H_5CH$ $-S-$, $-O-$ or a direct bond.

Preferably $R^{23}$ and $R^{24}$ are identical and are a substituted phenyl radical, in particular a 2,6-difluorophenyl radical which can additionally carry further substituents.

Examples of compounds of the formula IV are:
bis(cyclopentadienyl)-bis(pentafluorophenyl)-titanium
bis(cyclopentadienyl)-bis(3-bromotetrafluorophenyl)-titanium
bis(cyclopentadienyl)-bis(4-bromotetrafluorophenyl)-titanium
bis(cyclopentadienyl)-bis(2,4,5,6-tetrafluorophenyl)-titanium
bis(cyclopentadienyl)-bis(3,5-dichloro-2,4,6-trifluorophenyl)titanium
bis(cyclopentadienyl)-bis(4-morpholinotetrafluorophenyl)-titanium
bis(cyclopentadienyl)-bis(4-[4'-methylpiperazino]-tetrafluorophenyl)-titanium
bis(cyclopentadienyl)-bis(4-dibutylaminotetrafluorophenyl)-titanium
bis(cyclopentadienyl)-bis(2,4,6-trifluorophenyl)-titanium bis(methylcyclopentadienyl)-bis(pentafluorophenyl)-titanium
bis(methylcyclopentadienyl)-bis(4-morpholinotetrafluorophenyl)-titanium
bis(methylcyclopentadienyl)-bis(4-[4'-methylpiperazino]-tetrafluorophenyl)-titanium
bis(cyclopentadienyl)-bis(4-[dimethylaminomethyl]-tetrafluorophenyl)-titanium
bis(cyclopentadienyl)-bis(2,3,5,6-tetrafluorophenyl)-titanium
bis(methylcyclopentadienyl)-bis(2,3,5,6-tetrafluorophenyl)-titanium
bis(methylcyclopentadienyl)-bis(2,4,6-trifluorophenyl)-titanium
bis(cyclopentadienyl)-bis(2,3,6-trifluorophenyl)-titanium
bis(methylcyclopentadienyl)-bis(2,6-difluorophenyl)-titanium
bis(cyclopentadienyl)-bis(2,6-difluoro-3-methylphenyl)-titanium
bis(cyclopentadienyl)-bis(4-dibutylaminotetrafluorophenyl)-titanium
bis(cyclopentadienyl)-bis(4-methoxytetrafluorophenyl)-titanium
bis(cyclopentadienyl)-bis(4-butoxytetrafluorophenyl)-titanium
bis(cyclopentadienyl)-bis(4-isopropoxytetrafluorophenyl)-titanium
bis(cyclopentadienyl)-bis[4-(2-ethylhexyloxy)-tetrafluorophenyl]-titanium
bis(cyclopentadienyl)-bis(4-decyloxytetrafluorophenyl)-titanium
bis(cyclopentadienyl)-bis(4-octyloxytetrafluorophenyl)-titanium
bis(methylcyclopentadienyl)-bis(2,6-difluoro-3-methylphenyl)-titanium
bis(methylcyclopentadienyl)-bis(4-octyloxytetrafluorophenyl)-titanium
bis(methylcyclopentadienyl)-bis(4-decyloxytetrafluorophenyl)-titanium
bis(methylcyclopentadienyl)-bis(4-dodecyloxytetrafluorophenyl)-titanium
bis(methylcyclopentadienyl)-bis(4-butoxytetrafluorophenyl)-titanium
bis(methylcyclopentadienyl)-bis(4-ethoxytetrafluorophenyl)-titanium
bis(methylcyclopentadienyl)-bis(4-isopropoxytetrafluorophenyl)-titanium
bis(methylcyclopentadienyl)-bis(4-dibutylaminotetrafluorophenyl)-titanium
bis(cyclopentadienyl)-bis(2,6-difluorophenyl)-titanium
bis(cyclopentadienyl)-bis(2,4,5-trifluorophenyl)-titanium
bis(cyclopentadienyl)-bis(2,3-difluorophenyl)-titanium
bis(cyclopentadienyl)-bis(2,5-difluorophenyl)-titanium
bis(cyclopentadienyl)-bis(2,3,4,5-tetrafluorophenyl)-titanium
bis(methylcyclopentadienyl)-bis(2,3,4,5-tetrafluorophenyl)-titanium
bis(methylcyclopentadienyl)-bis(2,3,4,6-tetrafluorophenyl)-titanium
bis(methylcyclopentadienyl)-bis(2,3,6-trifluorophenyl)-titanium
bis(dimethylcyclopentadienyl)-bis(pentafluorophenyl)-titanium
bis(cyclopentadienyl)-3,4,5,6,3',4',5',6'-octafluorodiphenylsulphid-2,2'-diyltitanium
bis(cyclopentadienyl)-bis[4-(4,4-dimethylpiperazino)-tetrafluorophenyl]-titanium diiodide
bis(cyclopentadienyl)-bis[4-(trimethylammoniummethyl)-tetrafluorophenyl]-titanium diiodide.

In the compounds of the formula VII, the titanium, as in the compounds of the formula IV, is bonded to two π-anions of the cyclopentadienyl type $R^{21}$ and $R^{22}$. However, the other two ligands $R^{28}$ and $R^{29}$ differ from $R^{23}$ and $R^{24}$ in that the aromatic radical $R^{28}$ contains a $CF_3$ group in at least one ortho-position. The radical $R^{29}$ can likewise be an ortho-trifluoromethyl aromat or is alkynyl, phenylalkynyl, alkoxy, aryloxy, unsubstituted or halogen substituted acyloxy, halogen, $—Si(R^{25})_3$, $—Si(R^{25})_2 (R^{26})$, $—Sn(R^{25})_3$, $—OH$, $—CN$, $N_3$, $—NCO$ or $—NCS$, analogously to the radical $R^{24}$. Halogen $R^{29}$ is in particular fluorine, chlorine or bromine.

Examples of compounds of the formula VII are:
bis(cyclopentadienyl)-2-(trifluoromethyl)phenyl-titanium chloride or bromide or fluoride or acetate or trifluoroacetate
bis(cyclopentadienyl)-bis(2-trifluoromethyl)phenyl-titanium
bis(methylcyclopentadienyl)-2-(trifluoromethyl)phenyl-titanium chloride or fluoride or acetate or trifluoroacetate
bis(cyclopentadienyl)-(2-trifluoromethyl-6-fluorophenyl)-titanium fluoride
bis(cyclopentadienyl)-2,5-bis(trifluoromethyl)phenyl-titanium chloride
bis(indenyl)-2,5-bis(trifluoromethyl)phenyl-titanium chloride
bis(methylcyclopentadienyl)-2-(trifluoromethyl)phenyl-titanium thiocyanate or isocyanate or cyanide or trichloroacetate
bis(cyclopentadienyl)-2-(trifluoromethyl)phenyl-titanium thiocyanate or azide
bis(cyclopentadienyl)-(2-trifluoromethyl-4-methoxyphenyl)-titanium chloride
bis(cyclopentadienyl)-bis(2-trifluoromethyl-4-tolyl)-titanium.

In the mixtures according to the invention, the percentage weight ratio of A : B is 70–99.9 : 0.1–30, preference being given to a ratio of 90–99.5% by weight of A : 0.5–10% by weight of B. Component A, in terms of quantity, thus constitutes the main ingredient.

Preference is given to mixtures in which component
A) is either
$A_1$) a liquid benzil ketal of the formula I in which
$Ar^1$ and $Ar^2$ are phenyl, tolyl, chlorophenyl or bromophenyl,
$R^1$ is $C_4$–$C_{18}$-alkyl, $C_3$–$C_5$-alkenyl, $—CH_2COOR^4$, $—R^5—X$ $+CH(R^3)—CH_2—O—]_m R^6$ or tetrahydrofurfuryl, in which $R^3$ is H or $CH_3$,
$R^4$ is $C_1$–$C_{18}$-alkyl, allyl or $C_3$–$C_6$-alkoxyalkyl, $R^5$ is $C_2$–$C_4$-alkylene, X is halogen, $—COOR^4$, $—OR^4$ or a tertiary amino group having 2–12 C atoms,
m is 1–25 and $R^6$ is $C_1$–$C_{18}$-alkyl or $C_{12}$–$C_{22}$-alkylphenyl, and
$R^2$ is methyl or has one of the meanings given for $R^1$, or
$A_2$) is a liquid dioxolane of the formula II in which
$R^{11}$ is hydrogen, $C_1$–$C_5$-alkyl, $C_2$–$C_8$-alkoxyalkyl, $C_2$–$C_4$ hydroxyalkyl or benzyl,
$R^{12}$ is phenyl or 2-furyl or has one of the meanings given for $R^{11}$, or $R^{11}$ and $R^{12}$ together with the C atom to which they are bonded form a cyclopentane or cyclohexane ring,
$R^{13}$ is $C_1$–$C_4$-alkyl or phenyl,
$R^{14}$ is hydrogen or $C_1$–$C_4$-alkyl,
$R^{15}$ is hydrogen, $C_1$–$C_4$-alkyl or phenyl, and
$R^{16}$ is hydrogen, chlorine, methyl or methoxy, or
$A_3$) is a liquid acetal or ketal of the formula III in which
$Ar^3$ is phenyl, $R^{17}$ is hydrogen and $R^{18}$ and $R^{19}$ are $C_1$–$C_4$-alkyl, and component B is a titanocene compound of the formula IV in which
$R^{21}$ and $R^{22}$ are an unsubstituted or $C_1$–$C_4$-alkylsubstituted cyclopentadienyl anion and
$R^{23}$ and $R^{24}$ are a group of the formula VIII

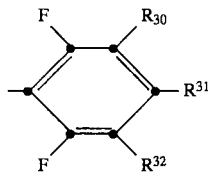  VIII in which $R^{30}$, $R^{31}$ and $R^{32}$ are independently of one another hydrogen, F, Cl, Br, $C_1$–$C_{14}$-alkoxy, a tertiary amino group or aminomethyl group having 2–20 C atoms or a quaternary ammonium or ammoniummethyl group having 3–24 C atoms or
$R^{23}$ and $R^{24}$ together are a divalent group of the formula

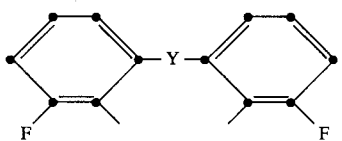

in which Y has the meaning given in claim 1, or component B is a titanocene compound of the formula VII in which $R^{21}$ and $R^{22}$ are an unsubstituted or $C_1$–$C_4$-alkylsubstituted cyclopentadienyl anion and $R^{28}$ is a group of the formula IX

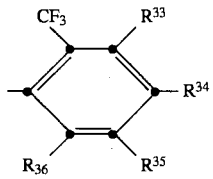  IX in which $R^{33}$, $R^{34}$, $R^{35}$ and $R^{36}$ are independently of one another hydrogen, F, Cl, Br or $C_1$–$C_{14}$-alkoxy and $R^{29}$ has one of the meanings given for $R^{28}$ or is F, Cl, Br, CN, $N_3$, unsubstituted or halogen-substituted $C_2$–$C_4$-acyloxy, —NCO or —NCS.

Preference is further given to mixtures in which component A is either a compound or a technical-grade mixture of the formula I in which $Ar^1$ and $Ar^2$ are phenyl, $R^1$ is $C_4$–$C_{16}$-alkyl, —$CH_2$—$COO(C_1$–$C_4$-alkyl), —$CH_2CH_2X$ or
, in which X is chlorine, $C_1$–$C_8$-alkoxy or a tertiary amino group having 2–8 C atoms, m is a value from 2 to 20, $R^6$ $C_8$–$C_{16}$-alkyl or $C_{13}$–$C_{16}$-alkylphenyl, $R^2$ is methyl or has one of the meanings given for $R^1$, or is a compound of the formula II in which $R^{11}$ and $R^{12}$ are methyl or together with the C atom to which they are bonded form a cyclopentane or cyclohexane ring, $R^{13}$ is methyl or phenyl, $R^{14}$ is H or methyl, $R^{15}$ is H, methyl or phenyl and $R^{16}$ is H, methyl or methoxy, or component A is 2,2-dimethoxyacetophenone or 2,2-diethoxyacetophenone, in particular to those mixtures which contain as component A a compound or a technical-grade mixture of the formula I.

Particular preference is given to mixtures which contain as component A a compound of the formula I in which $Ar^1$ and $Ar^2$ are phenyl and $R^1$ and $R^2$ are in which m is a value of from 2 to 12 and $R^6$ is $C_8$–$C_{16}$-alkyl or $C_{13}$–$C_{16}$-alkylphenyl.

Particular preference is further given to mixtures which contain as component B a compound of the formula IV in which $R^{21}$ and $R^{22}$ are a cyclopentadienyl or methylcyclopentadienyl anion and $R^{23}$ and $R^{24}$ are a group of the formula VIII in which either a) $R^{30}$ is H, F, Cl or Br, $R^{31}$ is fluorine or $C_1$–$C_{14}$-alkoxy and R is H, Cl or Br or b) $R^{30}$ and $R^{32}$ are H, F, Cl or Br and $R^{31}$ is H, Cl, Br, $C_1$–$C_{14}$-alkoxy, a tertiary amino or aminomethyl group or a quaternary ammonium or ammoniummethyl group, and to mixtures which contain as component B a compound of the formula VII in which $R^{21}$ and $R^{22}$ are a cyclopentadienyl or methylcyclopentadienyl anion, $R^{28}$ is 2-(trifluoromethyl)phenyl or 6-fluoro-2-(trifluoromethyl)phenyl and $R^{29}$ is defined in the same way as $R^{28}$ or is F, Cl, Br, CN, $N_3$, —O—CO—$CH_3$, —O—CO—$CF_3$, —NCO or —NCS.

The compounds of the formula I are partly known and partly novel. Novel compounds of the formula I are in particular those in which $Ar^1$ and $Ar^2$ are independently of each other phenyl or $C_1$–$C_4$-alkyl- or halogen-substituted phenyl, $R^1$ is a group of the formula $+$—$CH_2CH_2O$—$]_m$— ($C_8$–$C_{16}$-alkyl) or —$CH_2CH_2$ $_m$—$C_6H_4$—($C_1$–$C_{15}$-alkyl), where m is a value from 2– 20, $R^2$ is $C_1$–$C_4$-alkyl or has the meaning given for $R^1$. Of these, preference is given to those compounds, in which $R^1$ and $R^2$ are identical.

These novel compounds can be prepared by transketalization of lower alkylketals of the formula

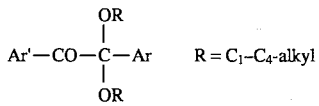    R = $C_1$–$C_4$-alkyl with oxyethylated alcohols of the formula $C_8$–$C_{16}$-alkyl $+$—$OCH_2CH_2$—$]_m$—OH or $C_1$–$C_{15}$-alkyl-$C_6$-$H_4$-(—$OCH_2CH_2$—$)_m$OH. For this purpose use is made of acid catalysts such as concentrated mineral acids, organic sulfonic acids or Lewis acids. Examples of such catalysts are concentrated sulfuric acid, concentrated phosphoric acid, hydrogen chloride, toluenesulfonic acid, methanesulfonic acid, trifluoromethanesulfonic acid, boron trifluoride or aluminium chloride. In the presence of such catalysts the reaction proceeds at a satisfactory rate at about 70°–120° C. The alcohol ROH freed in the course of the reaction is continuously distilled out of the reaction mixture. The amount of alcohol distilled off can be used to monitor the progress of the reaction.

The lower alkylketals used as starting material are known compounds. Preference is given to using the corresponding benzil dimethyl ketals (R=$CH_3$), since these are readily accessible or, like unsubstituted benzil dimethyl ketal, are commercially available. The oxyethylated alcohols are likewise commercially available in the form of technical-grade mixtures of compounds with alkyl radicals of different lengths and with different degrees of oxyethylation m. The index m is therefore an average value. On using such mixtures of oxyethylated alcohols, corresponding ketal mixtures are obtained. These are liquid compounds which are themselves suitable for use as initiators for the photopolymerization of ethylenically unsaturated compounds, but are highly suitable for use in particular as component A for mixtures with titanocenes of the formula IV or VII, since they have a powerful solubilizing action on such compounds.

A further class of novel compounds of the formula I are those in which $Ar^1$ and $Ar^2$ are independently of each other phenyl or $C_1$–$C_4$-alkyl- or halogen-substituted phenyl and $R^1$ and $R^2$ have the same meaning and are each a $C_9$–$C_{16}$-alkyl radical. These compounds too can be prepared by transketalization of the corresponding lower alkyl ketals, using $C_9$–$C_{16}$-alcohols.

The technical-grade reaction mixtures from the transketalization can contain from their preparation various amounts of disubstituted ketals, monosubstituted ketals, unconverted benzil dimethyl ketal and unconverted alcohol, each depending on the amounts used. Such technical-grade mixtures likewise have utility as photoinitiators.

To prepare the initiator mixtures according to the invention, component B is stirred in component A until a clear solution has formed. Preferably solution is effected by gentle heating to about 40°–60° C. Solution should be effected in darkrooms with red light illumination, since the dissolved titanocenes are sensitive to short-wave sunlight (up to 600 nm). The solutions thus obtained have a long storage life in the dark.

The ethylenically unsaturated compounds which can be photopolymerized using the above-defined mixtures of A and B are the same compounds which are customarily also used in the presence of other known initiators. They are monounsaturated or polyunsaturated compounds, the latter being of particular importance since they can be polymerized to form crosslinked —and hence insoluble—products.

Examples of monounsaturated compounds are acrylates or methacrylates of monohydric alcohols, acrylamides and similar acrylic acid derivatives, for example methyl, ethyl, butyl, isooctyl or hydroxyethyl acrylate, methyl or ethyl methacrylate, acrylonitrile, acrylamide, N-butyl(methacrylamide); and vinyl and allyl compounds, for example vinyl acetate, vinyl stearate, N-vinylpyrrolidone, vinylidene chloride, vinylbenzene or allyl acetate.

Examples of polyunsaturated compounds are acrylates, methacrylates or itaconates of polyols, for example ethylene glycol diacrylate, diethylene glycol dimethacrylate, triethylene glycol diacrylate, butane-1,4-diol diacrylate, propane-1,2-diol diacrylate, butane-1,3-diol dimethacrylate, neopentylglycol diacrylate, trimethylolpropane di(meth)acrylate, trimethylolethane di(meth)acrylate, glycerol diacrylate and triacrylate, pentaerythritol diacrylate, triacrylate and tetraacrylate or -methacrylate, dipentaerythritol tetraacrylate, pentaacrylate and hexaacrylate or -methacrylate or -itaconate, sorbitol tetraacrylate, sorbital hexamethacrylate, diacrylates or dimethacrylates of 1,4-cyclohexanediol, 1,4-dimethylolcyclohexane, bisphenol A, 2,2-bis(4-hydroxyphenyl)propane of polyethylene glycols or of oligoesters or oligourethanes having terminal hydroxyl groups. Suitable unsaturated monomers also include acrylamides, for example methylenebisacrylamide, hexamethylene-1,6-bisacrylamide, diethylenetriaminetrismethacrylamide, bis(methacrylamidopropoxy)ethane or 2-acrylamidoethyl acrylate. Examples of polyunsaturated vinyl and allyl compounds are divinylbenzene, ethylene glycol divinyl ether, diallyl phthalate, allyl methacrylate, diallyl maleate, triallyl isocyanurate and triallyl phosphate.

Polymeric or oligomeric polyunsaturated compounds can also be photopolymerized with crosslinking, for example unsaturated polyesters and copolyesters of maleic acid and fumaric acid, (meth)acrylates of polyvinyl alcohol or homopolymers or copolymers of butadiene or isoprene. Further usable polyunsaturated components are the reaction products of polyepoxides with acrylic or methacrylic acids. The polyepoxides used therein are predominantly the commercially available epoxy resin precursors which are obtainable in various molecular weights.

Usually these unsaturated compounds are photopolymerized in the form of mixtures, in order to be able to vary the properties of the polymers for the desired end-use. Examples thereof are mixtures of diacrylates with polyester acrylates or with polyurethane acrylates, mixtures of monoacrylates, diacrylates and triacrylates, mixtures of unsaturated polyesters of maleic acid with styrene or other mixtures of oligomeric polymers of unsaturated compounds with diacrylates, triacrylates or tetraacrylates. The mixtures can consist of two, three or more unsaturated components.

Photocurable compositions of the type used for various purposes usually contain, in addition to the photopolymerizable compounds and photoinitiators, a series of other additives. For instance, it is frequently customary to add thermal inhibitors which in particular during the preparation of the systems by mixing the components are to protect from premature polymerization. Compounds used for this purpose include for example hydroquinone, hydroquinone derivatives, p-methoxyphenol, β-naphthols or sterically hindered phenols, for example 2,6-di(tert-butyl)-p-cresol. Furthermore, it is possible to add small amounts of UV absorbers, such as those of the benzotriazole, benzophenone or oxalanilide type. It is also possible to add light stabilizers of the type of sterically hindered amines (HALS).

To increase the dark storage stability, it is possible to add copper compounds such as copper naphthenate, stearate or octoate, phosphorus compounds such as triphenylphosphine, tributylphosphine, triethyl phosphite, triphenyl phosphite or tribenzyl phosphate, quaternary ammonium compounds such as tetramethylammonium chloride or trimethylbenzylammonium chloride or hydroxyl amine derivatives, for example N-diethylhydroxyl amine.

To prevent the inhibiting action of atmospheric oxygen on photocurable mixtures, paraffin or similar waxy substances are frequently added. At the start of polymerization these substances float to the top (owing to insufficient solubility in the polymer) and form a transparent surface layer which prevents the ingress of air.

The photocurable compositions can also contain polymeric binders which are not unsaturated compounds. Examples thereof are polyacrylates, cellulose esters and ethers, polyvinyl esters, vinyl chloride polymers, polyamides, polyesters, polyethers and styrene/maleic anhydride copolymers. Further customary additives are pigments, dyes, fillers, adhesion promoters, wetting agents or flow control agents. For certain applications it is also possible to add solvents. However, preferably no solvents are used.

Further customary additives are photosensitizers which absorb at certain wavelengths and transfer the absorbed energy to the initiators or themselves act as additional initiator. Examples thereof are in particular thioxanthone, anthraquinone and coumarin derivatives.

Further customary additives are accelerants of the amine type, which are of importance in particular in pigmented formulations, since they act as chain transfer agents. Examples thereof are N-methyldiethanolamine, triethylamine, ethyl p-dimethylaminobenzoate and Michler's ketone. The action of the amines can be enhanced by adding aromatic ketones of the benzophenone type.

The photocurable compositions according to the invention are suitable for use as coating agents for substrates of any kind, for example wood, paper, ceramics, plastics such as polyesters and cellulose acetate films and metals such as copper and aluminium, where a protective layer or an image is to be applied by photopolymerization.

Photocuring is very important for printing inks, since the drying time of the binder is a crucial factor for the production speed of graphic products and should be of the order of fractions of seconds. UV-curable printing inks are important in particular for screen printing.

The photocurable mixtures according to the invention are also highly suitable for preparing printing plates. This involves using for example mixtures of soluble linear polyamides with photopolymerizable monomers, for example acrylamides, and a photoinitiator. Films and plates composed of these systems are exposed over the negative (or positive) of the print original, and the uncured portions are subsequently eluted with a solvent.

A further field of use for photocuring is the coating of metal, for example in the surface finishing of sheet metal for tubes, cans or bottle tops, and the photocuring of plastic coatings, for example PVC-based floor or wall coverings.

Examples of the photocuring of paper coatings are the colourless lacquering of labels, gramophone record sleeves or dust covers for books.

The use of photocurable compositions is also important for imaging techniques and for the optical preparation of information carriers. Herein the layer applied to the carrier is irradiated with short-wave light through a photomask and the unexposed areas of the layer are removed by treatment with a solvent (=developer). The exposed areas are crosslinked polymeric and hence insoluble and remain behind on the carrier. Visible images are formed on appropriate colouring. If the carrier is a metallized layer, then, after exposure to light and developing, the metal in the unexposed areas can be etched away or thickened by electroplating. In this way it is possible to produce printed circuits and photoresists.

Suitable exposure light sources emit light with a high short-wave content. Today appropriate industrial apparatuses and various types of lamps are available. Examples are carbon arc lamps, xenon arc lamps, mercury vapour lamps, metal/halogen lamps, fluorescent lamps, argon incandescent lamps or photographic floodlight lamps. Of late, laser light sources are also used. They can also be used without photomasks; the directed laser beam then writes directly on the photocurable layer.

The photocurable compositions according to the invention have good dark storage stability.

The following examples illustrate the preparation of the novel compounds and the preparation and use of initiator mixtures. Parts and % ages are by weight.

Example 1:
2,2-Bis[(3,6,9,12,15-pentoxapentacosyl)-oxy]-1,2-diphenylethan-2-one and analogous ketals A mixture of 76.9 g (0.3 mol) of benzil dimethyl ketal 227.1 g (0.6 mol) of Dobanol® 91-5 (technical-grade alcohol mixture having an average composition of $C_{10}H_{21}$—(O—$CH_2$—$CH_2$—$)_5$—OH from Shell Chemie) and 2.0 g (3.5 mol %) of toluene-4-sulfonic acid monohydrate is heated to 105°–110° C. under a water jet vacuum (20–30 mbar). At 50° C. everything has dissolved. The course of the reaction is monitored by thin layer chromatography. The reaction is complete when less than 1% of benzil dimethyl ketal is present. This is the case after about 20 h. The yellow, slightly turbid solution is then cooled and neutralized with 2.0 g of a 30% solution of sodium methylate in methanol. This is followed by heating under a water jet vacuum and stirring at 60° C. for two hours in order to remove the methanol. The dark brown solution is diluted with 500 ml of toluene, is stirred with 20 g of active carbon and is filtered through a Hyflo bed. The filtrate is concentrated under the vacuum. The result is 257.0 g of a cognac-coloured liquid (photoinitiator A-1)

Elemental analysis: $C_{54}H_{92}O_{13}$ (949.33)
Calculated C 68.32% H 9.77%
Found C 67.97% H 9.88%

The same method was used to prepare the following liquid benzil ketals:

| | | | | | |
|---|---|---|---|---|---|
| from Dobanol® 91-6 | (Photoinitiator A-2) | | | | |
| $C_{56}H_{96}O_{15}$ | Calculated | C | 66.64% | H | 9.59% |
| (1009.38) | Found | C | 66.69% | H | 9.74% |
| from Dobanol® 91-8 | (Photoinitiator A-3) | | | | |
| $C_{64}H_{112}O_{19}$ | Calculated | C | 64.84% | H | 9.52% |
| (1185.59) | Found | C | 64.88% | H | 9.59% |
| from Dobanol® 23-3 | (Photoinitiator A-4) | | | | |
| $C_{50}H_{84}O_9$ | Calculated | C | 72.42% | H | 10.21% |
| (829.22) | Found | C | 72.40% | H | 10.27% |
| from Dobanol® 23-6.5 | (Photoinitiator A-5) | | | | |
| $C_{68}H_{120}O_{17}$ | Calculated | C | 67.52% | H | 10.00% |
| (1209.70) | Found | C | 67.36% | H | 9.94% |
| from Dobanol® 25-3 | (Photoinitiator A-6) | | | | |
| $C_{52}H_{88}O_9$ | Calculated | C | 72.85% | H | 10.35% |
| (857.27) | Found | C | 73.04% | H | 10.35% |
| from Dobanol® 25-7 | (Photoinitiator A-7) | | | | |
| $C_{68}H_{120}O_{17}$ | Calculated | C | 67.52% | H | 10.00% |
| (1209.70) | Found | C | 67.71% | H | 10.05% |
| from Dobanol® 25-9 | (Photoinitiator A-8) | | | | |
| $C_{76}H_{136}O_{21}$ | Calculated | C | 65.87% | H | 9.89% |
| (1385.92) | Found | C | 65.99% | H | 9.90% |
| from Dobanol® 45-7 | (Photoinitiator A-9) | | | | |
| $C_{70}H_{124}O_{17}$ | Calculated | C | 67.93% | H | 10.10% |
| (1237.75) | Found | C | 68.08% | H | 9.90% |
| from Dobanol® 45-11 | (Photoinitiator A-10) | | | | |
| $C_{86}H_{156}O_{25}$ | Calculated | C | 64.96% | H | 9.89% |
| (1590.17) | Found | C | 64.88% | H | 9.87% |
| from Igepal® CA 520 | (Photoinitiator A-11) | | | | |
| (GAF Corporation | Calculated | C | 71.23% | H | 8.87% |
| $C_{62}H_{92}O_{13}$ | Found | C | 71.26% | H | 8.89% |
| (1045.42) | | | | | |
| from Igepal® CO 520 | (Photoinitiator A-12) | | | | |
| $C_{64}H_{96}O_{13}$ | Calculated | C | 71.61% | H | 9.01% |
| (1073,47) | Found | C | 71.05% | H | 9.01% |

Example 2:
1,2-Diphenyl-2-methoxy-2-[(3,6,9,12,15-pentoxapentacosyl)oxy]-ethan-2-one and analogous ketals A mixture of 76.9 g (0.3 mol) of benzil dimethyl ketal, 113.6 g (0.3 mol) of Dobanol® 1-5 (technical-grade alcohol mixture having an average composition of $C_{10}H_{21}$—(—O—$CH_2CH_2$—$)_5$—OH from Shell) and 1.0 g (1.75 mol %) of toluene-4-sulfonic acid monohydrate is heated to 100°–105° C. under a water jet vacuum (20–30 mbar). At 58° C. everything has dissolved. The course of the reaction is monitored by means of thin layer chromatography. After 17 hours the reaction is complete. The yellow, slightly turbid solution is then cooled and neutralized with 1.0 g of 30% methanolic sodium methylate solution, the solution darkening towards the end of the neutralization. This is followed by heating under a water jet vacuum and stirring at 60° C. for two hours in order to remove the methanol. The brown solution is diluted with 400 ml of toluene, stirred with 10 g of active carbon and filtered through a Hyflo bed. The filtrate is concentrated under vacuum. The result is 169.0 g (93.4% of theory) of a yellow liquid. (Photoinitiator A-13).
Elemental analysis $C_{35}H_{54}O_8$ (602.82)
Calculated: C 69.74% H 9.03%
Found : C 69.59% H 9.10%

The same method was used to prepare the following liquid benzil ketals:

| | | | | | |
|---|---|---|---|---|---|
| from Igepal® CA 520 | (Photoinitiator A-14) | | | | |
| $C_{39}H_{54}O_8$ | Calculated | C | 71.97% | H | 8.36% |
| (650.86) | Found | C | 72.03% | H | 8.28% |
| from Igepal® CO 520 | (Photoinitiator A-15) | | | | |
| $C_{40}H_{54}O_8$ | Calculated | C | 72.26% | H | 8.49% |
| (664.89) | Found | C | 71.85% | H | 8.34% |

Example 3:
2,2-Bis-decyloxy-1,2-diphenylethan-2-one and analogous ketals

A mixture of 76.9 g (0.3 mol) of benzil dimethyl ketal, 95.0 g (0.6 mol) of decanol and 2.0 g (3.5 mol %) of toluene-4-sulfonic acid monohydrate is heated to 85° C. under a water jet vacuum (20–30 mbar). At 60° C. everything has dissolved. The reaction is monitored by means of thin layer and gas chromatography. After 3.5 hours less than 1% of benzil dimethyl ketal is present. The yellow solution is then cooled down and neutralized with 2.0 g of a 30% sodium methylate solution in methanol. This is followed by heating under a water jet vacuum and stirring at 60° C. for 2 hours in order to remove the methanol. The yellow solution is diluted with 500 ml of toluene, stirred with 10 g of active carbon and filtered through a Hyflo bed. The filtrate is concentrated under vacuum. The result is 149 g of a yellow liquid which, according to gas chromatography analysis, is composed of about 84% of benzil didecyl ketal, about 9% of benzil decyl methyl ketal, about 4% of unconverted decanol, about 2% of benzil and about 0.7% of benzil dimethyl ketal. The structure of the components was confirmed by $^1$H-NMR spectroscopy.
(Photoinitiator A-16)
Elemental analysis $C_{34}H_{52}O_3$ (508.79)
Calculated: C 80.26% H 10.30%
Found: C 79.91% H 9.63%

The same method was used to prepare the following liquid benzil ketals:

| | | | | | |
|---|---|---|---|---|---|
| from Dobanol ® 91 (a blend of $C_9$, $C_{10}$ and $C_{11}$ primary alcohols.) (from Shell) $C_{34}H_{52}O_3$ (508.79) | (Photoinitiator A-17) Calculated Found | C C | 80.26% 80.10% | H H | 10.30% 10.24% |
| from Dobanol ® 23 $C_{40}H_{64}O_3$ (592.95) | (Photoinitiator A-18) Calculated Found | C C | 81.03% 81.12% | H H | 10.88% 10.66% |
| from Dobanol ® 25 $C_{42}H_{68}O_3$ (621.01) | (Photoinitiator A-19) Calculated Found | C C | 81.23% 81.23% | H H | 11.04% 10.83% |
| from Dobanol ® 45 $C_{42}H_{68}O_3$ (621.01) | (Photoinitiator A-20) Calculated Found | C C | 81.23% 81.04% | H H | 11.04% 11.13% |
| from Alfol ® 1084 (from Condea Petrochemie) $C_{38}H_{60}O_3$ (564.90) | (Photoinitiator A-21) Calculated Found | C C | 80.08% 80.72% | H H | 10.71% 11.00% |
| from Alfol ® 1218 $C_{40}H_{64}O_3$ (592.95) | (Photoinitiator A-22) Calculated Found | C C | 81.03% 80.81% | H H | 10.88% 11.21% |
| from isotridecyl alcohol (technical-grade mixture) $C_{40}H_{64}O_3$ (592.95) | (Photoinitiator A-23) Calculated Found | C C | 81.03% 80.95% | H H | 10.88% 10.77% |
| from hexadecanol $C_{46}H_{76}O_3$ (677.12) | Photoinitiator A-24 Calculated Found | C C | 81.60% 81.54% | H H | 11.31% 11.44% |

Example 4:
1,2-Diphenyl-2-decyloxy-2-methoxyethan-2-one

A mixture of 76.9 g (0.3 mol) of benzil dimethyl ketal, 47.5 g (0.3 mol) of decanol and 1.0 g (1.75 mol %) of toluene-4-sulfonic acid monohydrate is heated to 85° C. under a water jet vacuum (20–30 mbar). At 60° C. everything has dissolved. The course of the reaction is monitored by means of thin layer and gas chromatography. After 2.5 hours less than 1% of decanol are present. The yellow solution is then cooled and neutralized with 1.0 g of 30% sodium methylate solution. This is followed by heating under a water jet vacuum and stirring at 60° C. for 2 hours in order to remove the methanol. The yellow solution is diluted with 250 ml of toluene, stirred with 10 g of active carbon and filtered through a Hyflo bed. The filtrate is concentrated under vacuum. The result is 113.2 g (98.6% of theory) of a yellow liquid which, according to gas chromatography analysis, is composed of about 48% of benzil decyl methyl ketal, about 33% of benzil didecyl ketal, about 15% of unconverted benzil dimethyl ketal, about 3% of benzil and about 0.1% of decanol. The structure of components was confirmed by $^1$H-NMR spectroscopy. (Photoinitiator A-25)
Elemental analysis $C_{25}H_{34}O_3$ (382.55)
Calculated: C 78.49% H 8.96%
Found: C 78.42% H 8.90%

25 g of this mixture are separated over silica gel by means of medium pressure liquid chromatography (Labomatic, Allschwil, Switzerland) (cf. Th. Leutert and E. von Arx, J. Chrom, 292 (1984) 333–344). The eluant used is a mixture of hexane and ethyl acetate in a ratio of 9 : 1. Only the pure fractions are collected and concentrated. 8.2 g of benzil didecyl ketal (Photoinitiator A-26) and 6.1 g of benzil decyl methyl ketal (Photoinitiator A-27) are isolated in the form of a colourless liquid which is found to be at least 98.5% pure by gas chromatography.
Elemental analysis of decyl methyl ketal $C_{25}H_{34}O_3$ (382.55)
Calculated: C 78.49% H 8.96%
Found: C 78.78% H 8.71%
Elemental analysis of didecyl ketal $C_{34}H_{52}O_3$ (508.79)
Calculated: C 80.26% H 10.30%
Found: C 80.15% H 10.22%

The same method is used to prepare the following liquid benzil ketals as reaction mixtures:

| | | | | | |
|---|---|---|---|---|---|
| from Dobanol ® 91 $C_{29}H_{34}O_3$ (382.55) | (Photoinitiator A-28) Calculated Found | C C | 78.49% 78.47% | H H | 8.96% 8.91% |
| from Dobanol ® 25 $C_{25}H_{42}O_3$ (438.66) | (Photoinitiator A-29) Calculated Found | C C | 79.41% 79.42% | H H | 9.65% 9.38% |

Example 5: photocuring of an acrylate mixture

A photocurable composition is prepared by mixing the following components:
50 parts of an oligourethane acrylate (Actilan®AJ 20, SNPE, France),
10 parts of trimethylolpropane triacrylate
10 parts of dipentaerythritol pentaacrylate
15 parts of tripropylene glycol diacrylate
15 parts of N-vinylpyrrolidone
0.5 part of a flow control agent based on silicone (BYK®300, Byk-Mallinckrodt, West Germany)
Portions of this composition are mixed with the amounts of photoinitiator or initiator mixtures indicated in the table below. The initiator mixtures are solutions according to th e invention of a titanocene (component B) in a liquid initiator of the ketal type (component A). All operations are carried out under red light or yellow light.

The initiator-treated samples are applied to 10×15 cm aluminium panels in a thickness of 100 μm. On top of the liquid layer a 76 μm thick polyester film is placed, followed by a standardized test negative with 21 steps of different optical densities (Stauffer wedge). A second polyester film is placed on top, and the laminate thus obtained is fixed on a metal plate. The sample is then exposed using a 5 KW metal halide lamp at a distance of 30 cm for 5 seconds in a first test series and for 10 seconds in a second test series. After exposure, the films and the mask are removed, and the exposed layer is developed in an ethanol bath for 15 seconds and is subsequently dried at 60° C. for 5 minutes. The sensitivity of the initiator system used is characterized by reporting the last wedge step depicted without tackiness. The higher the number of the steps, the more sensitive the system. An increase by two steps approximately denotes a doubling in the rate of curing.

The initiators used, singly and mixed, comprise a series of the abovementioned photoinitiators A-1 to A-29 as well as the following initiators:

| A-30 | 4-benzoyl-2,2,4-trimethyl-1,3-dioxolane |
| A-31 | 4-benzoyl-2-methyl-4-phenyl-1,3-dioxolane |
| A-32 | α,α-diethoxyacetophenone |
| B-1 | bis(methylcyclopentadienyl)-bis(2,3,6-trifluorophenyl)-titanium |
| B-2 | bis(cyclopentadienyl)-bis(4-dibutylaminotetrafluorophenyl)-titanium |
| B-3 | bis(methylcyclopentadienyl)-bis(4-dibutylaminotetrafluorophenyl)-titanium |
| B-4 | bis(methylcyclopentadienyl)-2-(trifluoromethyl)phenyl-titanium isocyanate |
| B-5 | bis(methylcyclopentadienyl)-2-(trifluoromethyl)phenyl-titanium azide |
| B-6 | bis(methylcyclopentadienyl)-2-(trifluoromethyl)phenyl-titanium trifluoroacetate |
| B-7 | bis(methylcyclopentadienyl)-bis(4-decyloxytetrafluorophenyl)-titanium |

TABLE 1

| Amount of initiator*) | | Number of depicted steps | |
|---|---|---|---|
| Component A | Component B | after 5 s | after 10 s exposure |
| 2% A-1 | — | 5 | 7 |
| — | 0.05% B-1 | 6 | 8 |
| 1.95% A-1 | 0.05% B-1 | 7 | 9 |
| — | 0.1% B-1 | 8 | 10 |
| 1.9% A-1 | 0.1% B-1 | 10 | 11 |
| — | 0.05% B-2 | 6 | 8 |
| 1.95% A-1 | 0.05% B-2 | 8 | 10 |
| — | 0.1% B-2 | 8 | 10 |
| 1.9% A-1 | 0.1% B-2 | 10 | 11 |
| — | 0.05% B-3 | 6 | 8 |
| 1.95% A-1 | 0.05% B-3 | 8 | 10 |
| — | 0.1% B-3 | 8 | 10 |
| 1.9% A-1 | 0.1% B-3 | 10 | 11 |
| — | 0.2% B-4 | 5 | |
| 1.8% A-1 | 0.2% B-4 | 7 | |
| — | 0.2% B-5 | 6 | |
| 1.8% A-1 | 0.2% B-5 | 7 | |
| — | 0.2% B-6 | 7 | |
| 1.8% A-1 | 0.2% B-6 | 8 | |

| Amount of initiator*) | | Number of depicted steps | | |
|---|---|---|---|---|
| Component A | Component B | after 5 s | after 10 s exposure | after 10 s |
| 2% A-1 | — | 4 | 7 | 8 |
| — | 0.05% B-6 | 4 | 6 | 8 |
| 1.95% A-1 | 0.05% B-6 | 4 | 6 | 10 |
| 2% A-4 | — | 5 | 7 | 9 |
| 1.95% A-4 | 0.05% B-6 | 6 | 8 | 10 |
| 2% A-13 | — | 6 | 8 | 10 |
| 1.95% A-13 | 0.05% B-6 | 7 | 9 | 11 |
| 2% A-19 | — | 5 | 7 | 9 |
| 1.95% A-19 | 0.05% B-6 | 7 | 9 | 11 |
| 2% A-25 | — | 7 | 8 | 11 |
| 1.95% A-25 | 0.05% B-6 | 7 | 9 | 11 |
| 2% A-17 | — | 6 | 8 | 10 |
| 1.95% A-17 | 0.05% B-6 | 7 | 9 | 12 |
| 2% A-11 | — | 5 | 7 | 8 |
| 1.95% A-11 | 0.05% B-6 | 6 | 8 | 10 |
| 2% A-14 | — | 5 | 7 | 10 |
| 1.95% A-14 | 0.05% B-6 | 7 | 9 | 10 |
| 2% A-30 | — | 4 | 6 | 7 |
| 1.95% A-30 | 0.05% B-6 | 6 | 8 | 10 |
| 2% A-31 | — | 4 | 6 | 8 |
| 1.95% A-31 | 0.05% B-6 | 6 | 9 | 10 |
| 2% A-32 | — | 3 | 5 | 7 |
| 1.95% A-32 | 0.05% B-6 | 5 | 8 | 9 |
| 2% A-1 | — | 4 | 7 | 8 |
| — | 0.05% B-7 | 5 | 8 | 10 |
| 1.95% A-1 | 0.05% B-7 | 3 | 9 | 11 |
| 2% A-4 | — | 5 | 7 | 9 |
| 1.95% A-4 | 0.05% B-7 | 7 | 9 | 11 |
| 2% A-13 | — | 6 | 8 | 10 |
| 1.95% A-13 | 0.05% B-7 | 7 | 10 | 12 |
| 2% A-19 | — | 5 | 7 | 9 |
| 1.95% A-19 | 0.05% B-7 | 7 | 9 | 11 |
| 2% A-25 | — | 7 | 8 | 11 |
| 1.95% A-25 | 0.05% B-7 | 8 | 10 | 12 |
| 2% A-17 | — | 6 | 8 | 10 |
| 1.95% A-17 | 0.05% B-7 | 8 | 10 | 12 |
| 2% A-11 | — | 5 | 7 | 8 |
| 1.95% A-11 | 0.05% B-7 | 8 | 10 | 12 |
| 2% A-14 | — | 5 | 7 | 10 |
| 1.95% A-14 | 0.05% B-7 | 7 | 9 | 11 |
| 2% A-30 | — | 4 | 6 | 7 |
| 1.95% A-30 | 0.05% B-7 | 6 | 8 | 10 |
| 2% A-31 | — | 4 | 6 | 8 |
| 1.95% A-31 | 0.05% B-7 | 6 | 8 | 10 |
| 2% A-32 | — | 3 | 5 | 7 |
| 1.95% A-32 | 0.05% B-7 | 6 | 8 | 10 |

*)based on the photocurable composition

Example 6: Curing of an unsaturated polyester resin

In each case 0.4 g of liquid benzil ketal and 0.1 g of a flow control agent (Byk®300, Byk-Mallinckrodt) are dissolved in 20 g of an unsaturated polyester resin (Roskydal® 502, Bayer AG). These mixtures are applied in a thickness of 100 μm to white cardboard. The samples are irradiated a PPG irradiator using 2 lamps of 80 W/cm each with a belt speed of 10 m/min. In the course of irradiation it is determined how many passes are necessary until the sample is smudgeproof.

To assess the dark storage stability, the mixtures are stored at 60° C. in darkness for 16 days.

The following photoinitiators are used: A-1, A-4, A-11, A-12, A-13, A-14, A-15, A-16, A-17, A-18, A-19, A-20, A-25, A-26, A-27.

In all cases, two passes through the irradiator were sufficient to obtain a smudgeproof film.

All the samples were unchanged after 16 days of dark storage.

What is claimed is:

1. A compound of the formula I

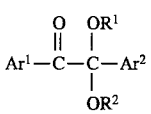

in which $Ar^1$ and $Ar^2$ are independently of each other phenyl or $C_1$–$C_4$-alkyl- or halogen-substituted phenyl and $R^1$ and $R^2$ have the same meaning and each is a $C_9$–$C_{16}$-alkyl radical.

2. A compound according to claim 1 of the formula I in which $Ar^1$ and $Ar^2$ are independently of each other phenyl or $C_1$–$C_4$-alkyl- or halogen-substituted phenyl and $R^1$ and $R^2$ have the same meaning and each is a $C_{12}$–$C_{16}$-alkyl radical.

3. A compound of the formula I

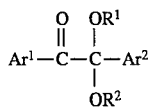 I in which $Ar^1$ and $Ar^2$ are independently of each other phenyl or $C_1$–$C_4$-alkyl- or halogen-substituted phenyl and $R^1$ and $R^2$ are independently of each other a $C_9$–$C_{15}$-alkyl radical.

4. A compound of the formula I

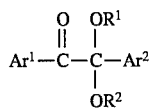

in which $Ar^1$ and $Ar^2$ are independently of each other phenyl or $C_{1-C4}$-alkyl- or halogen-substituted phenyl and $R^1$ and $R^2$ are independently of each other a $C_9$–$C_{11\text{-}alkyl}$ radical.

5. A compound of the formula I according to claim 4 in which $Ar^1$ and $Ar^2$ are each phenyl; and $R^1$ and $R^2$ each are a —$C_9H_{19}$ to —$C_{11}H_{23}$ mixture.

6. A compound of the formula I

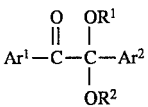 I in which $Ar^1$ and $Ar^2$ are independently of each other phenyl or $C_1$–$C_4$-alkyl- or halogen-substituted phenyl and $R^1$ and $R^2$ are independently of each other a $C_{12}$–$C_{15}$-alkyl radical.

7. A mixture of compounds having the formula

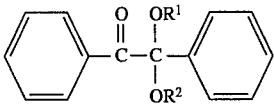

wherein $R^1$ and $R^2$ are —$C_9H_{17}$ to —$C_{11}H_{23}$.

8. A mixture according to claim 7 wherein $R^1$ and $R^2$ are primary —$C_9H_{17}$ to —$C_{11}H_{23}$.

9. A mixture according to claim 7 wherein $R^1$ and $R^2$ are identical.

* * * * *